Nov. 27, 1951 G. RODWIN 2,576,481

BALANCED CRYSTAL MICROWAVE CONVERTER

Filed July 28, 1948

INVENTOR
G. RODWIN
BY H. A. Burgess
ATTORNEY

Patented Nov. 27, 1951

2,576,481

UNITED STATES PATENT OFFICE 2,576,481

BALANCED CRYSTAL MICROWAVE CONVERTER

George Rodwin, Randall Manor, N. Y., assignor to Bell Telephone Laboratories, Incorporated, New York, N. Y., a corporation of New York Application July 28, 1948, Serial No. 41,025

6 Claims. (Cl. 250—20)

This invention relates to the intermodulation of electromagnetic waves and more particularly to balanced micro-wave converters employing non-linear impedances.

The use of non-linear impedance converters and more specifically crystal converters in the microwave frequency range is now well known in the art. It is also well known that balanced converters possess certain inherent advantages over the single-sided units. Many of these advantages may be found in the first edition of "Microwave Mixers" by Robert V. Pound, McGraw-Hill, 1948.

As therein noted in Chapter 6, balanced mixers eliminate the need of certain frequency selective circuits by suppressing local oscillator noise. The local oscillator and signal waves are so beaten together that the oscillator noise currents are balanced out. And in a similar manner, discrimination is obtained against intermediate frequencies arising from beats between two signal frequencies in the signal channel.

The application of the so-called magic or hybrid T, first disclosed in W. A. Tyrrell Patent No. 2,445,895, dated July 27, 1948, to balanced converters resulted in a mixer unit containing new features previously unrealized in balanced converters. Converters of this type are disclosed in the copending applications of C. F. Edwards, Serial No. 637,124, filed December 24, 1945, and Serial No. 643,093, filed January 24, 1946, Patent No. 2,563,591 granted August 7, 1951. These converters comprise two crystals mounted at opposite ends of a section of straight hollow pipe wave guide of rectangular cross-section. Joined to this main section of wave guide are two branch guides of similar cross-section, one connected in the electrical plane or series electrical and the other in the magnetic plane or parallel electrical. Signal waves are fed to the crystals through one of the branch guides, usually the H-plane branch, and local oscillator waves through the other.

There is no coupling between the two branch guides due to this manner of connection and hence no radiation of the local oscillator waves by the antenna. And since the signal guide impedance has no effect on the oscillator drive, the local oscillator is stabilized relative to variations in the signal guide impedance and power requirements are kept to a minimum.

In the magic T type of balanced converter as in most types, the crystal mixers are driven in shunt by the local oscillator, series electrical, and in push-pull by the signal waves, parallel electrical. All the advantages and features of the magic T balanced converter and of balanced converters in general heretofore mentioned have been retained in the present invention.

It is an object of this invention to improve and simplify the construction of balanced microwave converters.

In accordance with a preferred embodiment of the invention, the balanced mixer is constructed directly within the signal wave guide. The two crystal demodulators are mounted on opposite sides of the wave guide so that a voltage due to the signal waves being propagated down the guide is induced in the high frequency line connecting them. Signal waves are thus fed to the crystals in push-pull relation.

Local oscillator waves are introduced to the center of the high frequency line by the inner conductor of a coaxial cable which passes through a narrow wall of the guide transverse to the electric vector of the signal waves in the guide. The shunt feed circuit of the oscillator waves is completed through the wall of the guide and the outer conductor of the coaxial cable.

The beating of the two waves results in a balanced push-pull output signal at the intermediate difference frequency. This signal is tapped from the high frequency line by a pair of wires which feed the intermediate frequency signal to the output transformer. These two wires are effectively separated at the intermediate frequency by a double blocking condenser.

This particular construction results in a compact balanced mixer of simple design. The high frequency line connecting the crystals is kept as short as possible to obtain a system which will operate over a band of frequencies. Also, the balanced output leads appear close together, facilitating connecting to the output coil.

The nature of the invention and its various objects, features, and advantages will appear more fully in the following description of the accompanying drawings of which:

Figures 1, 2, 3, 4:
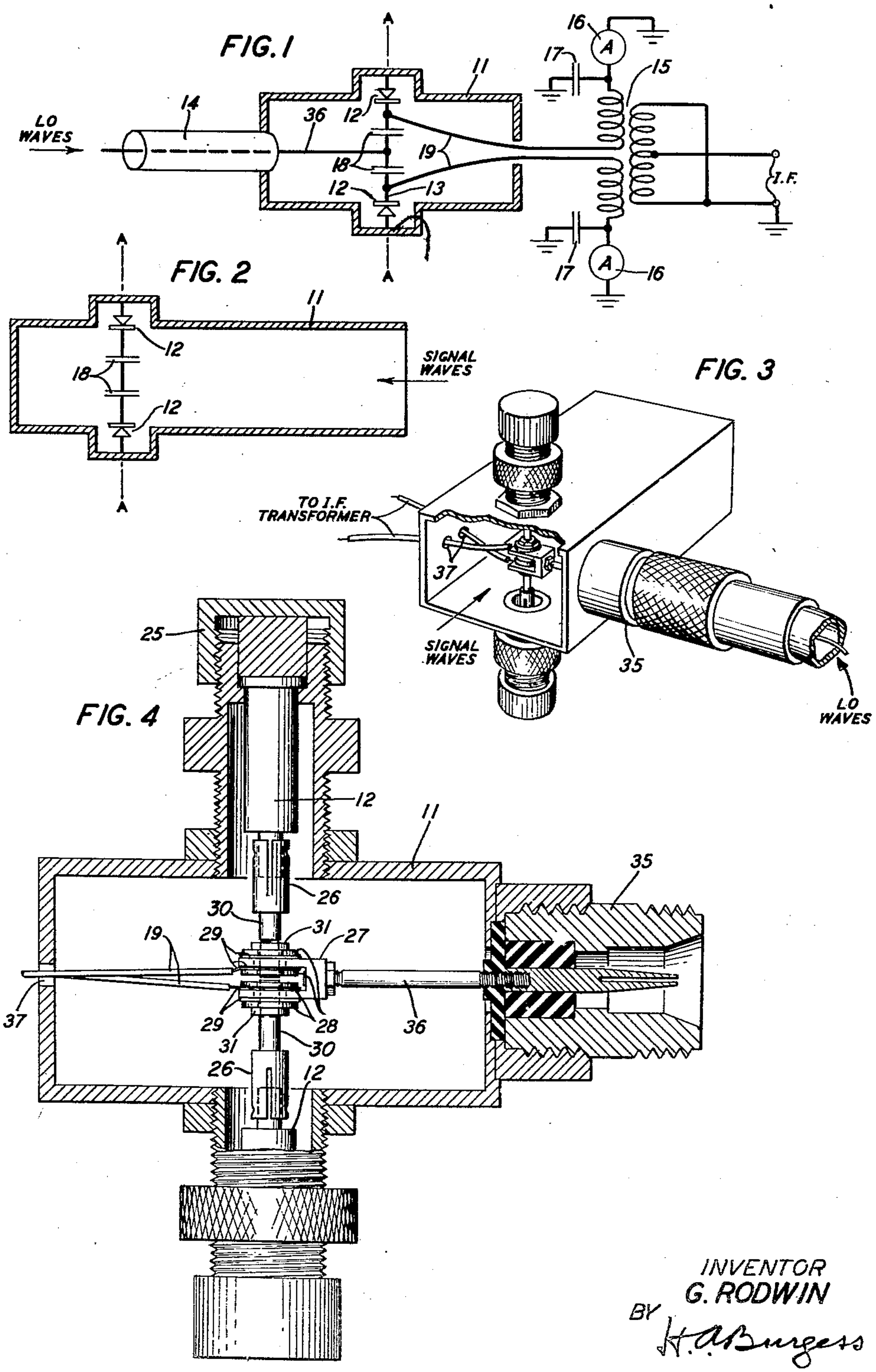
Fig. 1 is a schematic drawing illustrating the electrical circuits surrounding the invention.
Fig. 2 is a cross-sectional view of the wave guide of Fig. 1.
Fig. 3 is a pictorial representation of a preferred embodiment of the invention.
Fig. 4 is a detail of the construction within the guide of Fig. 3.

Referring now to Fig. 1 a section of straight hollow dielectric wave guide 11 is shown transverse to the direction of propagation of the electromagnetic signal waves therein. As hereinbefore described, the crystal demodulators 12 are mounted within the guide with the high frequency line 13 connecting them parallel to the electric vector of the signal waves being propagated down the guide. The local oscillator waves are fed in shunt to the crsytals by a coaxial conductor 14. The push-pull balanced output is fed to the balanced primary of the output transformer 15 and the resultant intermediate frequency wave taken from its unbalanced secondary. The ammeters 16, by-passed at high frequencies by capacitors 17, measure direct current output of the converter and thus serve as a measure of the balance in the converter. The condensers 18 prevent the intermediate frequency output leads 19 from being short-circuited by the high frequency line 36.

Fig. 2 illustrates a cross-sectional view of the signal wave guide of Fig. 1. The oscillator input is perpendicular to the plane of the drawing and is not shown.

Referring now to Fig. 4 which is a detail of Fig. 3, two crystal demodulators 12 are located in shielded pockets in the center of the wide walls of a rectangular wave guide 11 and connected directly thereto. These crystals may be removed by unscrewing cap 25 and pulling them out of chucks 26.

A U-bracket 27 is located in the center of the signal guide. Capacitors are provided between washers 28 and the legs of the U-bracket which are separated by mica washers 29. The crystal demodulators 12 are connected to the double condenser by the high frequency line 30 and holding nuts 31.

The alternation in direction of the electric vector of the signal waves which is parallel to the line 30 produces a voltage in the line and thus applies the signal waves in a push-pull manner to the crystal demodulators 12.

The local oscillator signal is brought into the device through the coaxial jack 35. It gets to the crystals through its inner conductor 36 and the common connection of the double blocking condenser.

The balanced intermediate frequency leads are electrically connected to the high frequency line at the condenser washers 28. They pass through an aperture 37 in the guide wall to the primary of the output transformer. The leads 19 are twisted through 90 degrees to present as little area as possible to the signal waves and also for mechanical considerations. It was also discovered in experimental models that a better impedance match to the transformer was obtained by this expedient.

As with all balanced converters, a certain amount of care must be exercised in selecting the crystals. Best balance is obtained when the crystals are chosen from groups displaying similar impedance characteristics over the operating frequency range. Tests on a converter of the type described in detail herein indicated that for most applications it is necessary only to choose crystals that will draw approximately equal currents. Improvement in balance of a few decibels may be obtained by adjusting the position of the crystals in their respective chucks. This may be done by screwing their holders in or out.

The high frequency line connecting the crystals is on the order of a wavelength long which will usually require the crystals to extend from the walls of the wave guide in shielded pockets as shown in Fig. 4. Although it is feasible that they be flush with the guide walls in a wave guide several wavelengths in width, the crystals would not be as accessible as when they protrude from the sides. Construction is also simplified by such an arrangement.

A balanced crystal microwave converter has thus been constructed which incorporates the features of not only balanced units in general, but also the magic T type in particular with simple and compact design. Further modifications and features within the spirit of the invention other than those already discussed will occur to one skilled in the art.

What is claimed is:

1. In a balanced converter, a section of straight hollow pipe dielectric wave guide of rectangular cross-section through which a first set of electromagnetic oscillations is propagated, a section of coaxial conductor over which a second set of electromagnetic oscillations is transmitted, said coaxial conductor having its outer conductor connected to a narrow wall of said guide and having its inner conductor extended through an aperture in said narrow wall to a central point in said guide, a pair of electrical pick-up members coupled to said inner conductor of the coaxial section at said central point of said guide and extending in opposite directions therefrom being parallel to the electric vector of the electromagnetic waves being propagated in said guide and each of said pick-up members connected to a non-linear impedance element which has an outer terminal connected to its adjacent wide wall of said wave guide section, and output transmission elements each connected to one of said electrical pick-up members.

2. The combination of claim 1 in which said output transmission elements extend substantially parallel to the magnetic vector of said first set of oscillations through an aperture in a narrow wall of said guide opposite said first-mentioned narrow wall.

3. The combination of claim 2 in which said output transmission elements are twisted uniformly through substantially 90 degrees total within the wave guide.

4. The combination of claim 1 in which the first set of oscillations comprises signal waves to be converted and the second set of oscillations is derived from a local oscillator.

5. The combination of claim 1 in which the non-linear impedance elements are located in shielded pockets projecting from the wide walls of the wave guide.

6. In combination with claim 1, means comprising a movable holder for said non-linear impedance elements for varying the position of said elements along an axis parallel to said pick-up members.

GEORGE RODWIN.

REFERENCES CITED

The following references are of record in the file of this patent:

UNITED STATES PATENTS

| Number | Name | Date |
|---|---|---|
| 2,142,159 | Southworth | Jan. 3, 1939 |
| 2,382,693 | Dallenbach | Aug. 14, 1945 |
| 2,408,420 | Ginzton | Oct. 1, 1946 |
| 2,420,892 | McClellan | May 20, 1947 |
| 2,441,598 | Robertson | May 18, 1948 |
| 2,462,841 | Bruck | Mar. 1, 1949 |
| 2,469,222 | Atwood | May 3, 1949 |